(12) United States Patent
Berasi et al.

(10) Patent No.: US 7,115,207 B2
(45) Date of Patent: Oct. 3, 2006

(54) MOLY MASK CONSTRUCTION AND PROCESS

(75) Inventors: Peter H. Berasi, Hopewell Junction, NY (US); Michael F. Jerome, Kingston, NY (US); Doris P. Pulaski, Holmes, NY (US); Robert P. Rippstein, Hopewell Junction, NY (US)

(73) Assignee: International Businss Machines Corporation, Armonk, NY (US)

( * ) Notice: Subject to any disclaimer, the term of this patent is extended or adjusted under 35 U.S.C. 154(b) by 246 days.

(21) Appl. No.: 10/604,213

(22) Filed: Jul. 1, 2003

(65) Prior Publication Data

US 2005/0001011 A1 Jan. 6, 2005

(51) Int. Cl.
 *B44C 1/22* (2006.01)
 *C25F 3/00* (2006.01)
 *G03F 1/00* (2006.01)

(52) U.S. Cl. ............................. 216/12; 430/5
(58) Field of Classification Search .............. 216/12; 430/5
See application file for complete search history.

(56) References Cited

U.S. PATENT DOCUMENTS 5,268,068 A * 12/1993 Cowell et al. ............. 216/12

2004/0238491 A1 * 12/2004 Berasi et al. ............. 216/83

OTHER PUBLICATIONS

NN62096 IBM Technical Disclosure Bulletin, vol. 5, Iss. 4, pp. 6-7, Sep. 1, 1962., US.*
NN7707577 IBM Technical Disclosure Bulletin, vol. 20, Iss. 2, pp. 57-578, Jul. 1, 1977., US.*
U.S. Appl. No. 09/596,754 (has been abandoned).
Technical Report:"Essonnes Tin Cap Process Development Summary" Nov. 24, 1994, 95A001149.
Technical Report:"Tempory Chip Attach Technique for Burn in of CMOS Chips With Tin Cap Pads".

* cited by examiner

*Primary Examiner*—Parviz Hassanzadeh
*Assistant Examiner*—Roberts Culbert
(74) *Attorney, Agent, or Firm*—Gibb I.P. Law Firm, LLC; James J. Cioffi, Esq.

(57) ABSTRACT

Disclosed is a method of manufacturing a metal mask for an integrated circuit chip interconnect solder bump. The invention deposits a very thick photoresist on both sides of a very thick molybdenum foil sheet (the molybdenum sheet is at least 8 mils thick and the photoresist is at least 5 microns thick). Then the process exposes and develops the photoresist to produce at least one opening having a diameter of at least 5 mil. The invention simultaneously etches both sides of the molybdenum foil using a very low etchant spray pressure of approximately 5 psi to form at least one via in the molybdenum foil that has a diameter of at least 12 mil and a knife-edge of 0.2 mil. The photoresist is removed after the etching process.

25 Claims, 3 Drawing Sheets

MOLY MASK CONSTRUCTION AND PROCESS

BACKGROUND OF INVENTION

1. Field of the Invention

The present invention generally relates to masks used to form interconnect solder bumps on integrated circuit chips and more particularly to an improved methodology that allows the mask images or openings to be made larger than could be made previously.

2. Description of the Related Art

During the manufacturing of integrated circuit chips, it is often necessary to form solder bumps to form interconnections to allow external devices to connect to the chip. Conventionally, various masks were used to deposit the conductive material to form the interconnect solder balls. However, for certain applications, these conventional processes have been shown to be inadequate for formation of the required mask image sizes. Therefore, the invention described below presents a new methodology of forming the masks that allows the mask openings to be made much larger than could have been made conventionally.

SUMMARY OF INVENTION

The following discloses a method of manufacturing a metal mask for an integrated circuit chip interconnect solder bump employing large input/output geometries. The invention deposits a thick photoresist on both sides of a thick molybdenum foil sheet (the inventive molybdenum sheet is typically 4 to 8 mils thick and the inventive photoresist is typically 12 microns thick). Then the process exposes and develops the photoresist to produce at least typically one opening having a diameter of about 3.9 mil. The invention simultaneously etches both sides of the molybdenum foil using a reduced etchant spray pressure of approximately 5 psi to form at least one via in the molybdenum foil that has a diameter of about 12 mil and a knife-edge of approximately 0.2 mil. The photoresist is removed after the etching process.

The etching process undercuts molybdenum adjacent the photoresist, leaving an unsupported edge of the photoresist after completion of the etching process. To enable this unsupported edge to survive the etching process undamaged, the photoresist thickness is increased and the etchant spray pressure is decreased.

The foregoing relates to the mask used for the lower portion of the solder bump; however, the invention also includes a method for making a mask for the tin-rich cap of an integrated circuit chip interconnect solder bump. This method deposits a photoresist on both sides of a molybdenum foil sheet; however, here the molybdenum sheet is at least typically 4 mils thick and the photoresist is at least typically 12 microns thick. Also, this process exposes and develops the photoresist to have at least typically one opening having a diameter of about 7 mil. In this process, the photoresist on one side of the molybdenum foil sheet has a 7 mil diameter opening and the photoresist on the other side of the molybdenum foil sheet has a 11 mil diameter. Therefore, the etching process produces an asymmetric via that is smaller on one side of the molybdenum foil sheet when compared to the other side of the molybdenum foil sheet.

Thus, the inventive DLP mask is twice as thick as a normal device mask, with a via opening 3 times larger. This construction enables low temperature joining of devices directly to boards without use of an interconnect package. The increased bump volume extends C4 capabilities beyond current practice. Fabricating the masks with conventional processes resulted in resist breakdown due to the longer etch times required to satisfy the thicker metal and increased geometries. The invention avoids resist breakdown during fabrication of the UMoly and TMoly masks. The invention provides for process modification to achieve reliable image formation in the thicker moly masks with increased geometries, while simultaneously maintaining knife-edge control. These modifications include increased photoresist film thickness, reduced pressure etchant delivery, tightened pH control to maintain the etch rate, etch bath ozonation to maintain oxidation/reduction potential (ORP), control of the level of dissolved molybdate in the etchant bath was developed and control of the total iron concentration.

The invention increases the photo-resist thickness and reduces spray pressure during metal etching to achieve a reduction in stress imparted to the photo-resist film during the etch process. This stress reduction enables the unsupported edge of the photo-resist film to survive without degradation irrespective of the unfavorable geometries required by the DLP bump geometry. The mask knife-edge is controlled for large geometry input/output through reduction of artwork image size as well as etch chemistry adjustments including pH, oxidation/reduction potential (ORP), and Molybdate and Fe species.

BRIEF DESCRIPTION OF DRAWINGS

The invention will be better understood from the following detailed description of preferred embodiments with reference to the drawings, in which.

DETAILED DESCRIPTION

The invention is used in a two-step process to form the solder bumps on the integrated circuit structure. The invention forms a first under-molybdenum (UMoly) mask to define the under-portion of the solder bump. Once the under-portion of the solder bump is formed, the first mask is removed and a second top-molybdenum (TMoly) mask is placed over the structure to form a tin-rich top portion of the solder bump.

At one point, the inventors utilized a process that was not necessarily conventionally known and which formed a UMoly mask that was approximately 3.8 mils thick, had an approximate 4.0 mil diameter via and an approximate 0.2 mil knife edge. By definition, the knife edge dimension is defined as ((Diameter #1)−(Diameter #2))/2 where Diameter #1 is the opening diameter at the mask surface and Diameter #2 is the minimum interior opening dimension.

When forming such an UMoly mask, the photoresist used to form the UMoly mask was approximately 5.0 microns thick and had approximately 2.1 mil diameter openings. The same processing formed a TMoly mask that was also approximately 3.8 mils thick, had an approximately 4.0 mil diameter via, and a knife edge less than or equal to 0.1 mil. However, the geometry of the deposited pad required fabrication of a unique mask construction wherein the metal thickness is at least 8 mils with image diameter equal to at least 12 mils and the knife edge approximate to 0.2 mil with masking to provide a tin rich cap.

Figure 1:
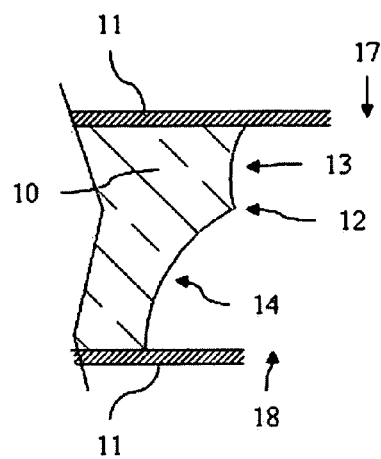
FIG. 1 is a cross-sectional schematic diagram of the TMoly mask according to the invention.
Figure 1:
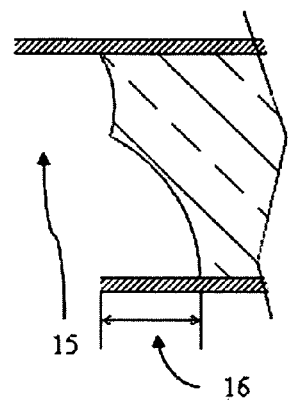
Figure 2:
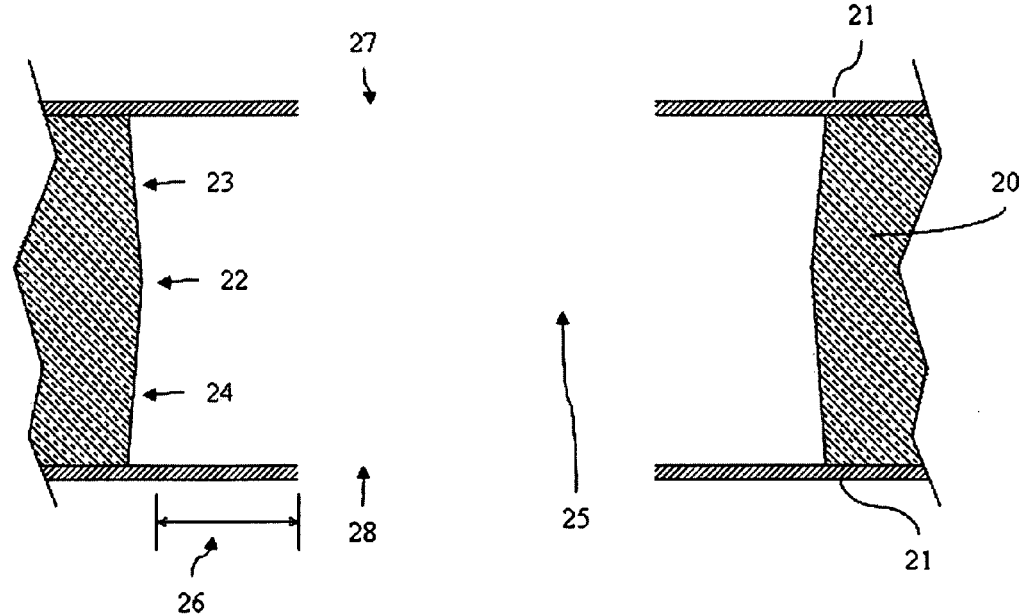
FIG. 2 is a cross-sectional schematic diagram of the UMoly mask according to the invention.

Therefore, the inventors developed a methodology to form the TMoly mask shown in FIG. 1 and the UMoly mask shown in FIG. 2. In these embodiments, the UMoly mask (FIG. 2) is approximately 8 mils thick molybdenum 20, has an approximate 12.0 mil diameter via 25, and an approximate 0.2 mil knife edge. In FIG. 2, the knife edge is shown as the difference in profile between the point 22 and adjacent regions 23 and 24 of the sidewall of the via 25. The point 22 extends only about 0.2 mil inward from regions 23 and 24, and this is referred to as a 0.2 mil knife edge. By definition, the knife edge dimension is defined as ((Diameter #1)–(Diameter #2))/2 where Diameter #1 is the opening diameter at the mask surface and Diameter #2 is the minimum interior opening dimension. When forming such a UMoly mask, the photoresist 21 was approximately 12 microns thick and had approximately 4 mil (e.g., 3.9 mil) diameter openings.

FIG. 1 shows the methodology to form the TMoly mask. Similar processing steps form a TMoly mask that is approximately 4.0 mils thick molybdenum 10, has a via 15 with an approximately 10 mil top opening 13 and an approximately 14 mil bottom opening 14. The knife edge in FIG. 1 is measured against the smaller (upper) opening diameter. When forming such a TMoly mask, the photoresist was approximately 12.0 microns thick and had an approximately 7.0 mil diameter opening at the top 17 and an approximately 11.0 mil diameter opening at the bottom 18.

Figure 3:
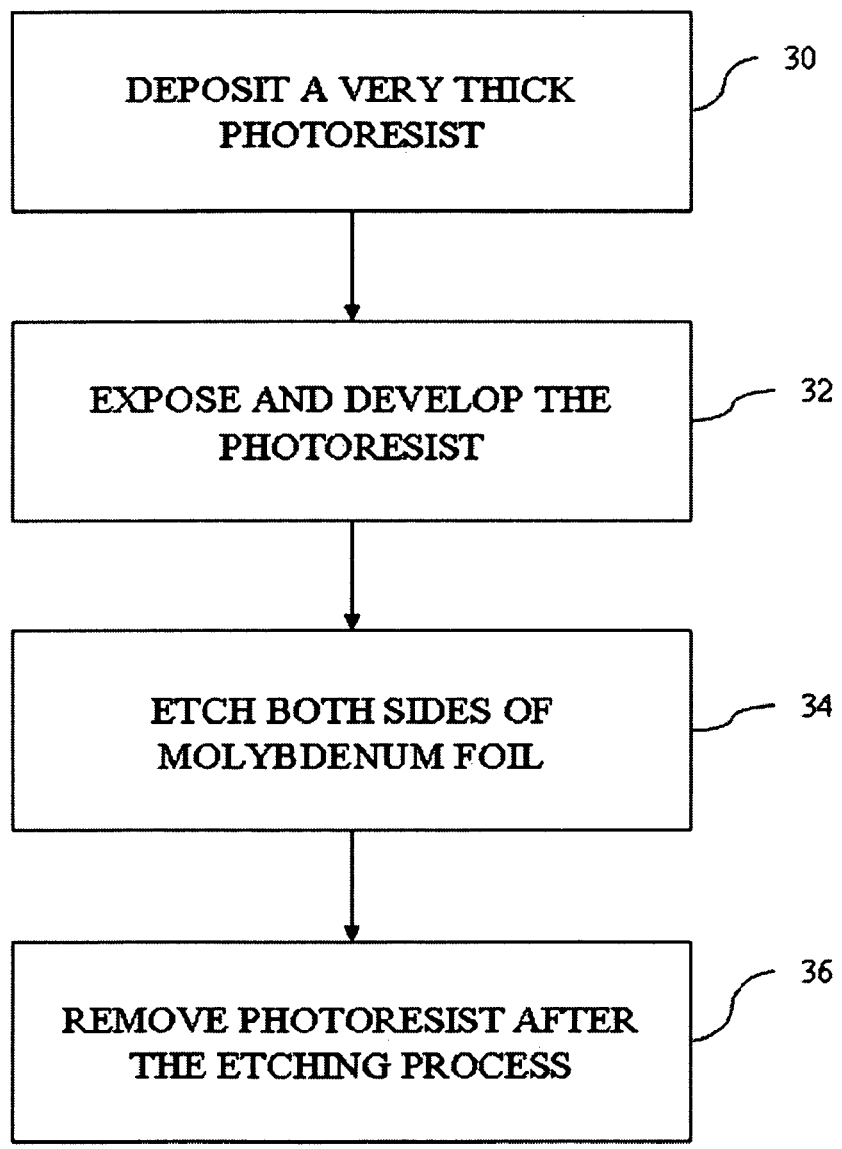
FIG. 3 is a flow diagram illustrating a preferred method of the invention.

The methodology of forming the UMoly mask shown in FIG. 2 is illustrated in flowchart form in FIG. 3.

In item 30, the invention deposits a very thick photoresist 21 on both sides of a very thick molybdenum foil sheet 20 (the molybdenum sheet is typically 4 to 8 mils thick and the photoresist is at least typically 12 microns thick). Then, in item 32, the process exposes and develops the photoresist to produce at least typically one opening 27, 28 having a diameter of typically 12 mil. The invention simultaneously etches both sides of the molybdenum foil 20 in item 34 using a reduced etchant spray pressure of approximately 5 psi to form at least typically one via 25 in the molybdenum foil 20 that has a diameter of typically 12 mil and a knife-edge of 0.2 mil. The photoresist 21 is removed after the etching process, as shown in item 36.

The etching process undercuts molybdenum 20 adjacent the photoresist 21, leaving an unsupported edge 26 of the photoresist after completion of the etching process. The invention adjusts the pH of the etchant spray (e.g., by adding sodium hydroxide to the etchant spray) typically three times during the etching process (item 34) to prevent damaging the unsupported edge 26 of the photoresist. The invention also monitors the concentration of molybdate complex, Fe concentration, and Oxidation/Reduction Potential (ORP) during the etching process 34.

Figure 4:
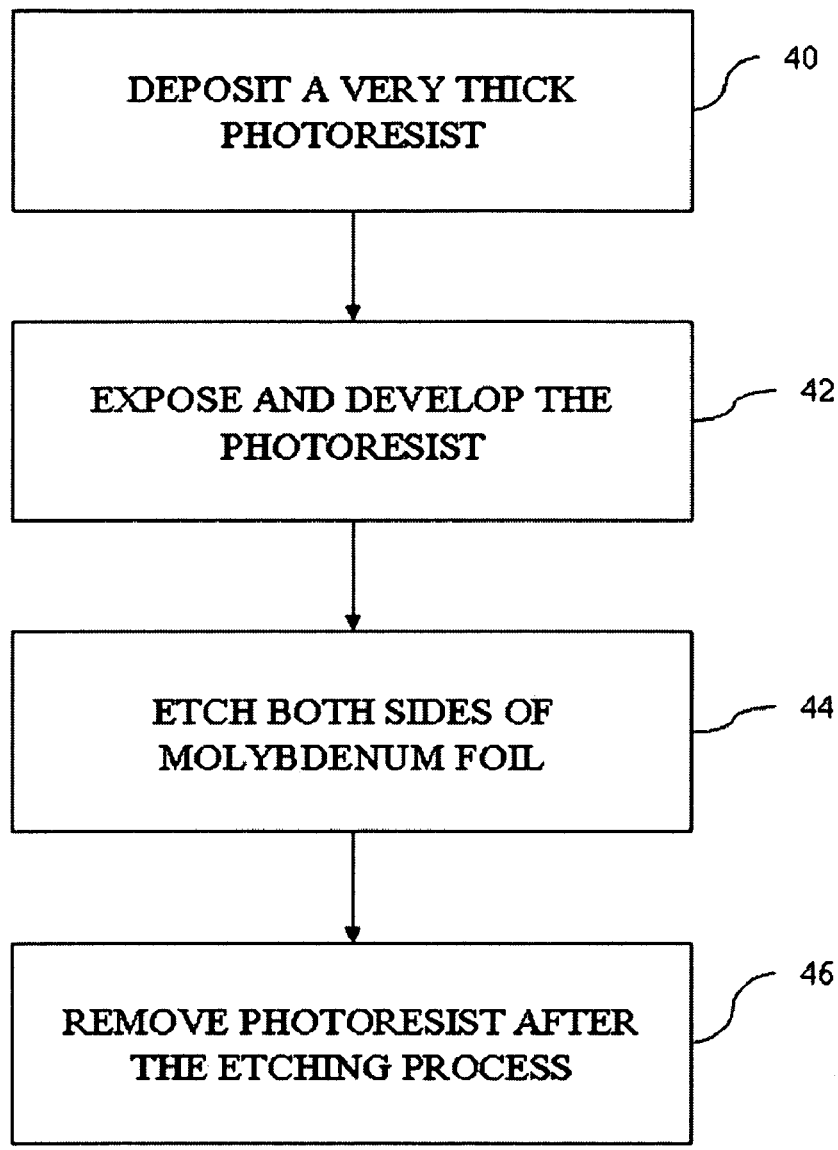
FIG. 4 is a flow diagram illustrating a preferred method of the invention.

FIG. 4 is a flowchart illustrating the methodology for making the TMoly mask shown in FIG. 1 for the tin-rich cap of an integrated circuit chip interconnect solder bump. This method begins in item 40 by depositing a photoresist 11 on both sides of a molybdenum foil sheet 10. Here the molybdenum sheet 10 is typically 4 mils thick and the photoresist 11 is typically 12 microns thick. Next, in item 42, this process exposes and develops the photoresist 11 to have at least one opening 17, 18 having a diameter of typically 7 mil. In this process the photoresist 11 on one side of the molybdenum foil sheet has a 7 mil diameter opening 17 and the photoresist 11 on the other side of the molybdenum foil sheet has a 11 mil diameter 18. Therefore, the etching process 44 produces an asymmetric via 15 that is smaller on one side 13 of the molybdenum foil a sheet when compared to the other side 14 of the molybdenum foil sheet. The photoresist 11 is removed after the etching process, as shown in item 46.

The etching process undercuts molybdenum 10 adjacent the photoresist 11, leaving an unsupported edge 16 of the photoresist after completion of the etching process. To enable this unsupported edge to survive the etching process undamaged, the photoresist thickness is increased and the etchant spray pressure is decreased. The invention also monitors the concentration of molybdate complex, Fe concentration, and Oxidation/Reduction Potential (ORP) during the etching process 44 to maintain the etchant activity.

The DLP (die level package) masks discussed above use a dual masking process (2 masks evaporated serially (UMoly and TMoly)) to achieve the required bump geometry. The inventive DLP mask is twice as thick as a standard device mask, with a via opening 3 times larger. The UMoly mask (FIG. 2), fabricated in thick material, provides the underlying bump metallurgy, while the TMoly mask (FIG. 1) provides a tin cap structure to define the final bump metallurgy deposition. The TMoly mask provides asymmetric opening diameters on the thick moly material. The combination of the DLP versions of UMoly and TMoly masks provides the ability to construct a solder bump of increased volume as compared to traditional C4 bumps. This construction enables low temperature joining of devices directly to boards without use of an interconnect package. The increased bump volume extends C4 capabilities beyond current practice. Prior to the invention, TMoly mask construction for evaporation of device input/output pads was typically limited to metal foils no thicker than 4 mils. The larger C4 ball deposited by the DLP UMoly mask involve use of foil material, of about 8 mils. Fabricating these masks with conventional processes resulted in resist breakdown due to the longer etch times required to satisfy the thicker metal and increased geometrics.

For the UMoly and TMoly mask fabrication, the invention provides for process modification to achieve reliable image formation with increased geometries while simultaneously maintaining knife-edge control for the increased diameter image designs. These modifications include increased photoresist film thickness, reduced pressure etchant delivery, tightened pH control to maintain the etch rate etch bath ozonation to maintain oxidation/reduction potential (ORP), control of the level of dissolved molybdate in the etchant bath was developed and control of the total iron concentration.

In order to embody this invention, the molybdenum mask manufacturing process incorporates the following. First, the invention increases the photoresist thickness (modification of foil resist coat) and reduces spray pressure during metal etching to achieve a reduction in stress imparted to the photoresist film during the etch process. This stress reduction enables the unsupported edge 16, 26 of the photo-resist film to survive without degradation irrespective of the unfavorable geometries (metal foil thickness and large input/output diameter) required by the DLP bump geometry. The mask knife-edge is in part controlled for large geometry input/output through reduction of artwork image size (modification of personality expose and develop). The invention utilizes an extension of metal etching time as well as etch chemistry adjustments (modification of metal etching) including pH, oxidation/reduction potential (ORP), and Molybdate and Fe species (that are discussed in greater detail below).

The stress on the resist disk which defines the etched via size is approximated by $S=(P \times r)/(2 \times t)$, where P=pressure applied across the disk surface, r=disk radius (via diameter/2), and t=resist thickness. The applied pressure P is, in part, proportional to the etchant spray pressure. To avoid rupturing the photoresist disk during etching, the etchant spray pressure is reduced from 12 PSI to 5 PSI. The reduction can occur any time before the developing via diameter reaches about ½ of its final size, and continues through etch completion. The resist thickness is also increased from its normal value of about 5 microns to about 12 microns to reduce the shear forces. The artwork image size (opening in the photoresist) is made smaller than expected from linear scaling of conventional windage values to increase the etching time and, thereby, reducing the remaining knife edge to values nearly those of conventional device geometries.

In addition, the etchant chemistry parameters pH, ORP (Oxidation-Reduction Potential), (Potassium Sodium Molybdate Concentration) and (Iron Concentration) are controlled to allow the photoresist layer to survive the extended etch processing times, almost 3 times longer than with conventional product (e.g., 22 minutes vs. 60 minutes), while achieving a small knife edge. During processing of the molybdenum masks through the mask etching, process control measurements are taken of pH to maintain the bath within tight limits to avoid reduction of etchant activity through the extended etch time. The pH is adjusted three times, typically, during the etching process by additions of sodium hydroxide to the etchant (e.g. 12.5–12.8 pH).

The requirements of thick masks, with large inputs/outputs, necessitate the improved image formation and mask knife-edge control. In order to accomplish the more precise processing requirements, certain process variables are adjusted to increase the etch time required to complete mask fabrication. In this way, more precision is achievable in determination of etch end-point detection resulting in reduced mask-to-mask variation. This technique enables final image size variation and knife-edge to be contained within specification limit requirements. In addition, tightened controls are employed to reduce the sources of process variation to enable fabrication of the large input/output mask designs.

With respect to windage adjustment of the input/output diameter, the diameter on glass masters is intentionally reduced in size with the invention to provide reduced input/output diameter within the exposed photo-resist image. As an example, a glass master input/output diameter of 8 mils can be used to achieve a final mask input/output diameter of 12.0 mils on a mask thickness of 8 mils. However, the invention utilizes a glass master input/output diameter of approximately 3.9 mils to achieve the same input/output diameter of 12.0 mils (and producing a final knife-edge dimension of 0.2 mil) by extending etching time.

To achieve the more precise imaging required for the thick mask and large input/output mask designs, the molybdenum etching process is also revised as described below to impart increased control and consistency. The Sodium Potassium Molybdate is an ionic complex that is generated within the etch bath as the etch process progresses. It is a byproduct of the etching of moly foil by an etchant mix of potassium ferricyanide with sodium hydroxide. In order to fabricate the advanced design masks having more precise geometry control, the invention monitors the concentration of the molybdate complex within the etch bath and controls this to tightened limits. The advanced process controls the molybdate concentration within the following limits: 30 to 38 gms/liter as compared to 20 to 40 gms/l for the standard process. Conventional practices ignored the molybdate concentration and deployed the etch process without reference to molybdate concentration; however this resulted in significant variations in etch rate with wide variations in the dimensional attributes of finished masks. The inventive monitoring and controlling of the molybdate concentration maintains etch activity within a tight band and enables masks to be made with the consistency of geometries required by the advanced product.

In similar fashion, the invention applies tighter limits to Fe concentrations in the etch bath. Fe is present in the bath at two separate valence levels from the ferricyanide source in the etchant makeup. Its presence at the proper valence level maintains adequate etchant activity. Tightened limits have been established for Fe concentration to assure etchant activity and achieve the required product geometries for advanced products. The new limits are as follows: 25 to 33 gms/l of Fe as compared to prior limits of 20 to 35 gms/l for standard products.

Oxidation/Reduction Potential (ORP) control through ozonation of the etchant has been employed to reduce the frequency of replacement due to inadequate ORP. This treatment has been extended so as to maintain ORP in a tight band, thereby maintaining tight control over etchant activity. This practice is used by the invention to tighten limits to support processing of advanced products. The increased consistency achieved in ORP provides improvement in effective control over mask geometries to satisfy the needs of advanced designs. The tightened ORP controls are 340 to 360 mV as compared to 300 to 380 mV for standard products.

The inventive DLP UMoly mask is thicker than a normal device mask, with a via opening 3 time larger. This construction enables low temperature joining of devices directly to boards without use of an interconnect package. The increased bump volume extends C4 capabilities beyond current practice. Fabricating the masks with conventional processes resulted in resist breakdown due to the longer etch times requires to satisfy the thicker metal and increased geometries. The invention avoids resist breakdown during fabrication of the UMoly and TMoly masks. The invention provides for process modification to achieve reliable image formation in the thicker moly masks with increased geometries, while simultaneously maintaining knife-edge control for the increased diameter image designs. These modifications include increased photoresist film thickness, reduced pressure etchant delivery, tightened pH control to maintain the etch rate, etch bath ozonation to maintain oxidation/reduction potential (ORP), control of the level of dissolved molybdate in the etchant bath, and control of the total iron concentration.

The invention increases the photoresist thickness and reduces spray pressure during metal etching while increasing the etching time to achieve a reduction in stress imparted to the photoresist film during the etch process. This stress reduction enables the unsupported edge of the photoresist film to survive without degradation irrespective of the unfavorable geometries required by the DLP bump geometry. The mask knife-edge is controlled for large geometry input/output through reduction of artwork image size. The invention utilizes an extension of metal etching time as well as etch chemistry adjustments including pH, oxidation/reduction potential (ORP), and Molybdate and Fe species.

While the invention has been described in terms of preferred embodiments, those skilled in the art will recognize that the invention can be practiced with modification within the spirit and scope of the appended claims.

What is claimed is:

1. A method of manufacturing a metal UMoly mask for an integrated circuit chip interconnect solder bump, said method comprising:
   depositing a photoresist on both sides of a molybdenum foil sheet, wherein said molybdenum foil sheet is approximately 8 mils thick and said photoresist is approximately 12 microns thick;
   exposing and developing said photoresist to have at least one opening having a first diameter of approximately 4 mil; and
   simultaneously etching both sides of said molybdenum foil sheet for a time period sufficient to produce a via through said molybdenum foil sheet such that said via has a second diameter of approximately 12 mils and a knife-edge of approximately 0.2 mils,
   wherein said etching comprises using an etchant spray with a pressure of approximately 5 psi and undercutting said photoresist adjacent to said at least one opening to form an unsupported edge of said photoresist, and
   wherein said depositing of said photoresist that is approximately 12 microns thick and said using of said etchant spray with said pressure of approximately 5 psi ensures that after said time period said unsupported edge survives.

2. The method in claim 1, wherein ensuring that said unsupported edge survives allows reliable image formation to be achieved.

3. The method in claim 1, further comprising adjusting the pH of said etchant spray at least three times during said etching process to maintain the etching rate.

4. The method in claim 3, wherein said process of adjusting the pH of said etchant spray comprises adding sodium hydroxide to said etchant spray.

5. The method in claim 1, wherein said etching process further comprises monitoring and controlling:
   the concentration of molybdate complex;
   Fe concentration; and
   Oxidation/Reduction Potential (ORP).

6. A method of manufacturing a metal TMoly mask for a tin-rich cap of an integrated circuit chip interconnect solder bump, said method comprising:
   depositing a photoresist on both sides of a molybdenum foil sheet, wherein said molybdenum foil sheet is approximately 4 mils thick and said photoresist is approximately 12 microns tick;
   exposing and developing said photoresist to have a first opening on a first side of said molybdenum foil sheet and a second opening on a second side of said molybdenum foil sheet, wherein said first opening has a first diameter of approximately 7 mils and said second opening has a second diameter of approximately 11 mils; and
   simultaneously etching both sides of said molybdenum foil sheet for a time period sufficient to produce a via through said molybdenum foil sheet such that said via has a third diameter of approximately 10 mils adjacent to said first opening, a fourth diameter of approximately 14 mils adjacent to said second opening and a knife-edge of approximately 0.2 mils,
   wherein said etching comprises using an etchant spray with a pressure of approximately 5 psi and undercutting said photoresist adjacent to both said first opening and said second opening to form an unsupported edge of said photoresist, and
   wherein said depositing of said photoresist that is approximately 12 microns thick and said using of said etchant spray with said pressure of approximately 5 psi ensures that after said time period said unsupported edge survives.

7. The method in claim 6, wherein said etching process produces an asymmetric via that is smaller on said first side of said molybdenum foil sheet when compared to said second side of said molybdenum foil sheet.

8. The method in claim 6, wherein ensuring that after said time period said unsupported edge survives allows reliable image formation to be achieved.

9. The method in claim 6, further comprising adjusting the pH of said etchant spray at least three times during said etching process maintain the etching rate.

10. The method in claim 9, wherein said process of adjusting the pH of said etchant spray comprises adding sodium hydroxide to said etchant spray.

11. The method in claim 6, further comprising removing said photoresist after said etching process.

12. The method in claim 6, wherein said etching process further comprises monitoring and controlling:
   the concentration of molybdate complex;
   Fe concentration; and
   Oxidation/Reduction Potential (ORP).

13. A method of manufacturing a metal UMoly mask for an integrated circuit chip interconnect solder bump, said method comprising:
   depositing a photoresist on both sides of a molybdenum foil sheet, wherein said molybdenum foil sheet is approximately 8 mils thick and said photoresist is approximately 12 microns thick;
   exposing and developing said photoresist to have at least one opening having a first diameter of approximately 4 mil; and
   simultaneously etching both sides of said molybdenum foil for a time period sufficient to produce a via through said molybdenum foil sheet such that said via has a second diameter of approximately 12 mils and a knife-edge of approximately 0.2 mils,
   wherein said etching comprises:
      using an etchant spray with a pressure of approximately 5 psi;
      periodically adjusting a chemistry of said etchant spray to avoid a reduction in etchant activity; and
      undercutting said photoresist adjacent to said at least one opening to form an unsupported edge of said photoresist, and
   wherein said depositing of said photoresist that is approximately 12 microns thick, said using of said etchant spray with said pressure of approximately 5 psi, and said adjusting of said chemistry ensures that after said time period said unsupported edge survives.

14. The method in claim 13, wherein ensuring that after said time period said unsupported edge survives allows reliable image formation to be achieved.

15. The method in claim 13, wherein said adjusting of said chemistry comprises adjusting the pH of said etchant spray at least three times during said etching process to prevent damaging said unsupported edge of said photoresist.

16. The method in claim 15, wherein said process of adjusting the pH of said etchant spray comprises adding sodium hydroxide to said etchant spray.

17. The method in claim 13, further comprising removing said photoresist after said etching process.

18. The method in claim 13, wherein said adjusting of said chemistry further comprises monitoring and controlling:
the concentration of molybdate complex;
Fe concentration; and
Oxidation/Reduction Potential (ORP).

19. A method of manufacturing a metal TMoly mask for a tin-rich cap of an integrated circuit chip interconnect solder bump, said method comprising:
depositing a photoresist on both sides of a molybdenum foil sheet, wherein said molybdenum foil sheet is approximately 4 mils thick and said photoresist is approximately 12 microns thick;
exposing and developing said photoresist to have a first opening on a first side of said molybdenum foil sheet and a second opening on a second side of said molybdenum foil sheet, wherein said first opening has a first diameter of approximately 7 mils and said second opening has a second diameter of approximately 11 mils; and
simultaneously etching both sides of said molybdenum foil for a time period sufficient to produce a via through said molybdenum foil sheet such that said via has a third diameter of approximately 10 mils adjacent to said first opening, a fourth diameter of approximately 14 mils adjacent to said second opening and a knife-edge of 0.2 mils,
wherein said etching comprises:
using an etchant spray with a pressure of approximately 5 psi;
periodically adjusting a chemistry of said etchant spray to avoid a reduction in etchant activity; and
undercutting said photoresist adjacent to both said first opening and said second opening to form an unsupported edge of said photoresist, and
wherein said depositing of said photoresist that is approximately 12 microns thick, said using of said etchant spray with said pressure of approximately 5 psi, and said adjusting of said chemistry ensures that after said time period said unsupported edge survives.

20. The method in claim 19, wherein said etching process produces an asymmetric via that is smaller on said first side of said molybdenum foil sheet when compared to said second side of said molybdenum foil sheet.

21. The method in claim 19, wherein ensuring that after said time period said unsupported edge survives allows reliable image formation to be achieved.

22. The method in claim 19, wherein said adjusting of said chemistry comprises adjusting the pH of said etchant spray at least three times during said etching process to prevent damaging said unsupported edge of said photoresist.

23. The method in claim 22, wherein said process of adjusting the pH of said etchant spray comprises adding sodium hydroxide to said etchant spray.

24. The method in claim 19, further comprising removing said photoresist after said etching process.

25. The method in claim 19, wherein said adjusting of said chemistry further comprises monitoring and controlling:
the concentration of molybdate complex;
Fe concentration; and
Oxidation/Reduction Potential (ORP).

* * * * *